(12) United States Patent
Chang et al.

(10) Patent No.: US 8,921,851 B2
(45) Date of Patent: Dec. 30, 2014

(54) NON-POLAR PLANE OF WURTZITE STRUCTURE MATERIAL (71) Applicant: National Chiao Tung University, Hsinchu (TW)

(72) Inventors: Li Chang, Hsinchu (TW); Yen-Teng Ho, Tainan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/798,882

(22) Filed: Mar. 13, 2013

(65) Prior Publication Data

US 2013/0240876 A1    Sep. 19, 2013

(30) Foreign Application Priority Data

Mar. 14, 2012   (TW) .............................. 101108690 A (51) Int. Cl.
*H01L 29/04* (2006.01)
*C30B 23/02* (2006.01)
*C30B 23/06* (2006.01)
*C30B 23/08* (2006.01)
*C30B 25/18* (2006.01)
*C30B 25/06* (2006.01)
*C30B 29/16* (2006.01)
*C30B 29/40* (2006.01)
*H01L 29/20* (2006.01)
*H01L 29/24* (2006.01)
*H01L 21/02* (2006.01)

(52) U.S. Cl.
CPC ............ *C30B 23/025* (2013.01); *H01L 29/045* (2013.01); *C30B 23/066* (2013.01); *C30B 23/08* (2013.01); *C30B 25/186* (2013.01); *C30B 25/06* (2013.01); *C30B 25/18* (2013.01); *C30B 29/16* (2013.01); *C30B 29/406* (2013.01); *H01L 29/2003* (2013.01); *H01L 29/24* (2013.01); *H01L 21/0242* (2013.01); *H01L 21/02433* (2013.01); *H01L 21/02554* (2013.01); *H01L 21/02609* (2013.01); *H01L 21/02631* (2013.01)
USPC .......................................................... 257/43

(58) Field of Classification Search
CPC ............ H01L 21/3141; H01L 21/0254; H01L 21/02554; H01L 21/31604; H01L 21/31691; H01L 21/02472; H01L 21/02538; H01L 21/02387; H01L 21/02609; H01L 29/2003; H01L 29/7869; H01L 33/007; H01L 21/02458
See application file for complete search history.

(56) References Cited

U.S. PATENT DOCUMENTS

| 2010/0163931 | A1* | 7/2010 | Fujioka et al. | ................. 257/200 |
| 2011/0062437 | A1* | 3/2011 | Chang et al. | .................... 257/43 |
| 2011/0062440 | A1* | 3/2011 | Adekore et al. | ................. 257/43 |

OTHER PUBLICATIONS

Wei-Lin Wang, Chun-Yen Peng, Yen-Teng Ho, Shu-Chang Chuang, and Li Chang, Defects in m-plane ZnO epitaxial films grown on (112) LaAlO3 substrate, J. Vac. Sci. Technol., May/Jun. 2011, vol. 29, No. 3, Hsinchu, Taiwan.

(Continued)

*Primary Examiner* — Marcos D. Pizarro
*Assistant Examiner* — Sue Tang
(74) *Attorney, Agent, or Firm* — Bacon & Thomas, PLLC (57) ABSTRACT

The present invention relates to a method for growing a novel non-polar ($13\bar{4}0$) plane epitaxy layer of wurtzite structure, which comprises the following steps: providing a single crystal oxide with perovskite structure; using a plane of the single crystal oxide as a substrate; and forming a non-polar ($13\bar{4}0$) plane epitaxy layer of wurtzite semiconductors on the plane of the single crystal oxide by a vapor deposition process. The present invention also provides an epitaxy layer having non-polar ($13\bar{4}0$) plane obtained according to the aforementioned method.

14 Claims, 6 Drawing Sheets

(56) References Cited

OTHER PUBLICATIONS

Tzu-Chun Yen, Wei-Lin Wang, Chun-Yen Peng, Jr-Sheng Tian, Yen-Teng Ho, and Li Chang, Defects in nonpolar (1 3 4 -0) ZnO epitaxial film grown on (114) LaAlO3 substrate, Journal of Vacuum Science & Technology A 32, 02B103 (2014), AVS: Science & Technology of Materials, Interfaces, and Processing.

* cited by examiner

NON-POLAR PLANE OF WURTZITE STRUCTURE MATERIAL

BACKGROUND OF THE INVENTION

1. Field of the Invention

The present invention relates to a method for growing a non-polar ($13\bar{4}0$) plane epitaxy layer of wurtzite structure semiconductors with a single crystal oxide as a substrate, particularly to a method for growing a non-polar ($13\bar{4}0$) plane epitaxy layer of zinc oxide or Group III nitride with wide band gap, low lattice mismatch, and high thermal stability. The present invention also provides an epitaxy layer having a non-polar ($13\bar{4}0$) plane.

2. Description of Related Art

GaN and its related nitrides have received great attention in recent years due to the successful application in solid light emitting devices and laser diodes. These nitrides belong to a wurtzite crystal structure of hexagonal crystal system, which mainly grows in a direction along c axis. Prior studies show that GaN grown in the direction along c axis may present a planar arrangement and induce a built-in electric field by polarization effect, which in turn, results in the offsets of valence band and conduction band, thus reducing the light-emitting quantum efficiency.

Therefore, it has become an important development direction in industries to grow a non-polar plane, such as GaN of m-plane and a-plane to eliminate the polarization effect for promoting the quantum efficiency of a solid light-emitting device. There have been numerous excellent achievements in promoting the light-emitting efficiency of devices by using non-polar crystal plane to eliminate spontaneous polarity of GaN quantum well light emitting devices.

On the other hand, similar to GaN or other Group (III) nitrides, ZnO also has a high potential for laser applications due to the higher exciton binding energy (60 meV). However, ZnO and GaN materials have the same wurtzite structure, and the development of non-polar plane is needed for zinc oxide to overcome the problem of low light-emitting quantum efficiency.

In the prior studies, there have been many researches on non-polar plane GaN and ZnO grown by heterogeneous nucleation. In conclusion, a-plane GaN and ZnO single crystal can successfully grow on a r-plane sapphire substrate. M-plane GaN and ZnO single crystal can epitaxially grow on a m-plane silicon carbide substrate, a m-plane sapphire substrate and a γ-LiAlO$_2$(100) substrate.

Therefore, it would be a great advance in the field of solid light emitting element to grow a novel non-polar crystal plane with better crystal and material properties than the existing non-polar a-plane and m-plane.

SUMMARY OF THE INVENTION

The present invention aims to provide a method for growing a novel non-polar ($13\bar{4}0$) plane epitaxy layer of wurtzite structure using a single crystal oxide as a substrate, and the non-polar ($13\bar{4}0$) crystal plane is grown on a specific cross section of the substrate. Thereby, a non-polar crystal plane with an improved optical property can be obtained, and the mismatch between the substrate and the epitaxial layer can be reduced. Moreover, the substrate can maintain a thermal stability at high temperature and be suitable for growing a zinc oxide or Group III nitride epitaxy layer.

The present invention also aims to provide a non-polar ($13\bar{4}0$) plane epitaxy layer to prevent the offsets of valence band and conduction band caused by the polarization effect due to atom arrangement in the epitaxy layer that reduces the light-emitting quantum efficiency, wherein the non-polar ($13\bar{4}0$) plane has a better optical property than the existing non-polar a-plane and m-plane.

To achieve the objects, the present invention provides a method for growing a non-polar ($13\bar{4}0$) plane epitaxy layer of wurtzite structure, which comprises the following steps: providing a single crystal oxide with perovskite structure; selecting a plane of the single crystal oxide as a substrate; and forming a non-polar ($13\bar{4}0$) plane epitaxy layer of wurtzite semiconductors on the plane of the substrate by a vapor deposition process.

The present invention also provides an epitaxy layer having non-polar ($13\bar{4}0$) plane obtained by a method, which comprises the following steps: providing a single crystal oxide with perovskite structure; selecting a plane of the single crystal oxide as a substrate; and forming a non-polar ($13\bar{4}0$) plane epitaxy layer of wurtzite semiconductors on the plane of the substrate by a vapor deposition process.

The plane of the present invention is a crystal plane or a cross section of the single crystal oxide, wherein the plane is a plane having a Miller index of {114} or another cross section which can grow the non-polar ($13\bar{4}0$) plane epitaxy layer of wurtzite semiconductors. Prior studies indicate that the non-polar a-plane ZnO has a dual domain structure due to a symmetric atomic configuration of a surface lattice on a plane of a perovskite structure single crystal oxide. However, domain boundary effect may cause many defects to deteriorate the optical property. Thus, based on the concept of miscut substrate, the present invention provides a single crystal oxide with a surface of asymmetric atomic configuration by the miscut method, and then a non-polar crystal plane of wurtzite semiconductors with single domain can be grown epitaxially on the specific cross section of the single crystal oxide.

Furthermore, the type of the single crystal oxide with perovskite structure used in the invention is not particularly limited, wherein the single crystal oxide is preferably an oxide with perovskite structure such as LaAlO$_3$, LaNiO$_3$, LaGaO$_3$, SrTiO$_3$, (LaSr)(AlTa)O$_3$, PrAlO$_3$, or NdAlO$_3$, and most preferably LaAlO$_3$. LaAlO$_3$ single crystal oxide has a melting point as high as 2450° K. Besides the advantages of good thermal stability and inhibiting interface formation, using LaAlO$_3$ single crystal oxide is cost effective as compared to the conventional substrate since other crystal planes or cross sections of 2 inches or more can be used as substrates for growing the non-polar ($13\bar{4}0$) plane epitaxy layer, thus increasing the applicability.

The non-polar ($13\bar{4}0$) plane epitaxy layer of the present invention may be a zinc oxide, or a Group III nitride. The zinc oxide may be further doped with magnesium, calcium, strontium, barium, cadmium, aluminum, gallium, indium, or an alloy combined thereof and preferably ZnO, ZnMgO, or ZnCdO, most preferably ZnO. In addition, the Group III nitride may be gallium nitride, indium nitride, aluminum nitride, indium gallium nitride, aluminum gallium nitride, aluminum indium nitride, or aluminum indium gallium nitride.

In addition, the method for growing the non-polar ($13\bar{4}0$) plane epitaxy layer on the substrate is not particularly limited in the present invention. Suitable approaches include physical vapor deposition or chemical vapor deposition, preferably pulsed laser deposition process, sputtering process, electron beam (thermal) evaporation method, molecular beam epitaxy, or organic metal chemical vapor deposition, and most preferably pulsed laser deposition process.

According to the method of the present invention, the method may further comprise cleaning the substrate, preferably with hot acetone and isopropanol, before growing the non-polar (13$\bar{4}$0) plane epitaxy layer of wurtzite semiconductors on the plane of the substrate by a vapor deposition process.

Furthermore, the present invention also provides a photoelectric device, characterized by using the non-polar (13$\bar{4}$0) plane epitaxy layer formed by the above method as a semiconductor material, wherein the photoelectric device may be a light emitting device, a detecting device, or a photovoltaic device. Truly, epitaxy is the foundation of solid state lighting industry. The epitaxy process of a non-polar crystal plane provided by the invention is an important development for exploiting a high efficiency solid state illuminating component in the future. Therefore, the novel non-polar (13$\bar{4}$0) plane epitaxy layer of the present invention improves the light emitting efficiency of optical elements through eliminating polarity, and has a better optical property than the existing non-polar a-plane and m-plane, and a great prospect for applications in light emitting devices.

Generally, the present invention provides a novel non-polar crystal plane for growing a zinc oxide or Group III nitride, which is a specific crystal plane of a single crystal oxide with high thermal stability. Specifically, in an embodiment of the present invention, the LaAlO$_3$ crystal plane serves as a substrate to grow a novel non-polar (13$\bar{4}$0) crystal plane of zinc oxide or Group III nitride epitaxy layer. The novel non-polar crystal plane of the present invention provides a viable alternative of non-polar crystal plane in addition to the current a-plane and m-plane, and the present invention may be further applied to non-polar crystal plane ZnO or GaN solid state light emitting devices.

DETAILED DESCRIPTION OF THE PREFERRED EMBODIMENT

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

The method for growing of a novel non-polar (13$\bar{4}$0) plane epitaxy layer with a single oxide as a substrate will be illustrated below in detail.

EXAMPLE 1

Growth of the Non-Polar (13$\bar{4}$0) Crystal Plane Of Oxide Zinc

First, a single crystal oxide with perovskite structure was provided, wherein the single crystal oxide was a 2-inch LaAlO$_3$ (LAO) single crystal oxide with a thickness of 0.5 nm.

Figure 1:
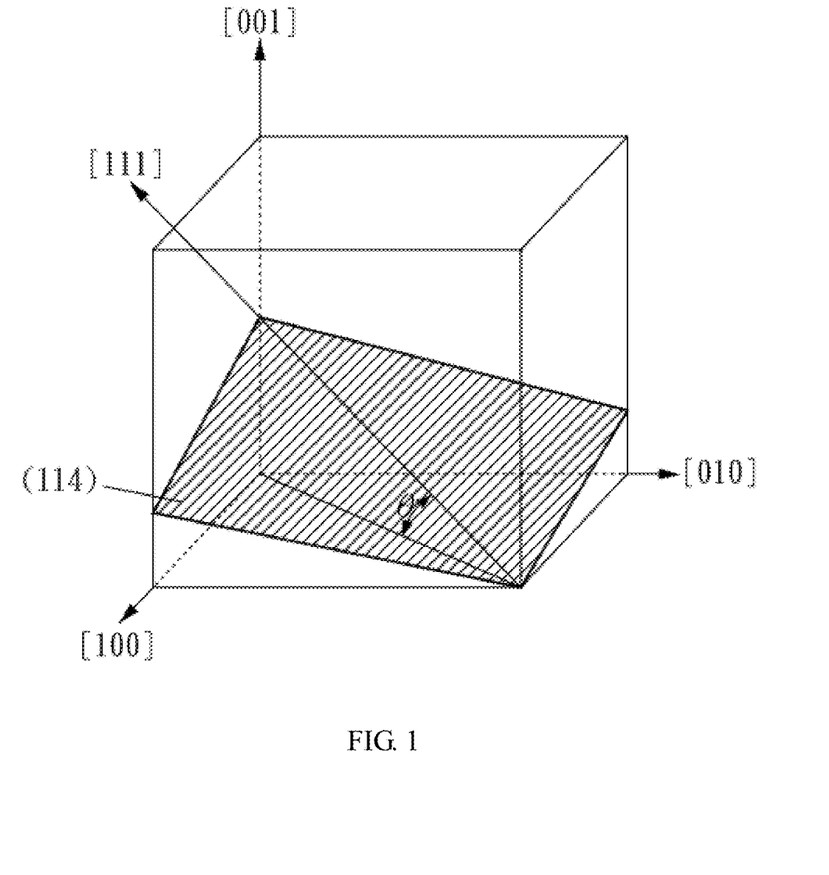
FIG. 1 shows a schematic cross-section of the LaAlO$_3$ (LAO) crystal.
Figure 2:
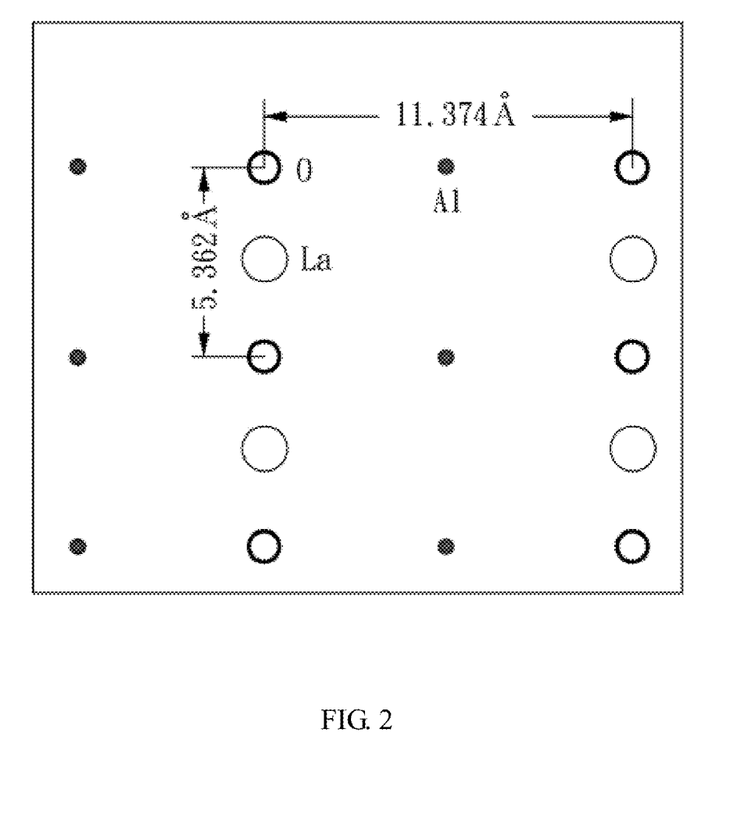
FIG. 2 shows a schematic view of the oxygen atom arrangement on the surface of the tangent plane (114) of the LaAlO$_3$ (LAO) crystal.

Next, referring to FIG. 1 and FIG. 2, FIG. 1 shows a schematic cross-section of plane (114) of the LaAlO$_3$ (LAO) crystal having a miscut angle of about 19.47±1°, and FIG. 2 shows a schematic of the oxygen atom arrangement on the surface of the tangent plane (114) of the LaAlO$_3$ (LAO) crystal. In the present embodiment, a LaAlO$_3$ (LAO) crystal plane with a specific tangent plane is provided. After a plane (001) with a symmetry lattice constant is adjusted to an asymmetric plane (114), it has a unit length of 5.364 Å×11.367 Å as shown in FIG. 2. The crystal plane (114) is used as a substrate, which is cleaned with hot acetone and isopropanol and then placed in a vacuum chamber (a vacuum degree of 1×10$^{-8}$ ton is maintained inside the chamber before a substrate is inserted into the chamber.)

Then, a hot-pressed zinc oxide lump material is provided as a target. The zinc oxide lump material may be doped with an alloy of magnesium, calcium, strontium, barium, cadmium, aluminum, gallium, indium, or combinations thereof. In this example, the used target is a zinc oxide lump material having a purity of 99.99%.

Figure 3:
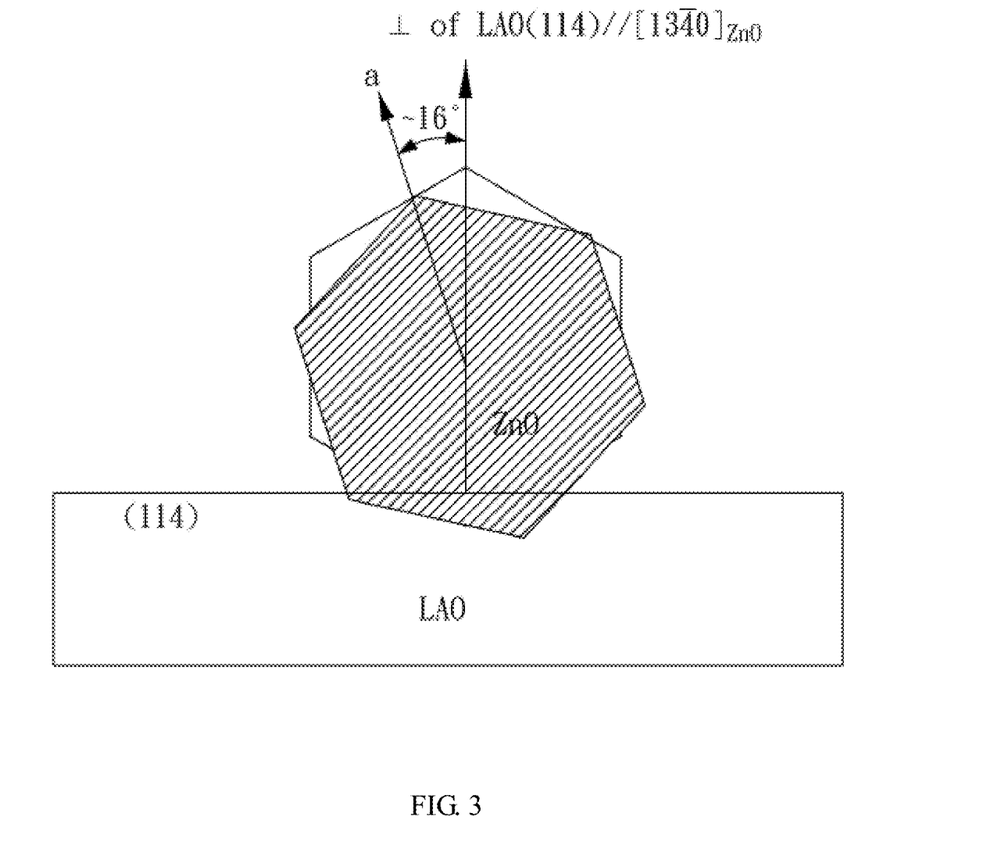
FIG. 3 shows a schematic view of the zinc oxide non-polar (13$\bar{4}$0) plane.
Figure 4:
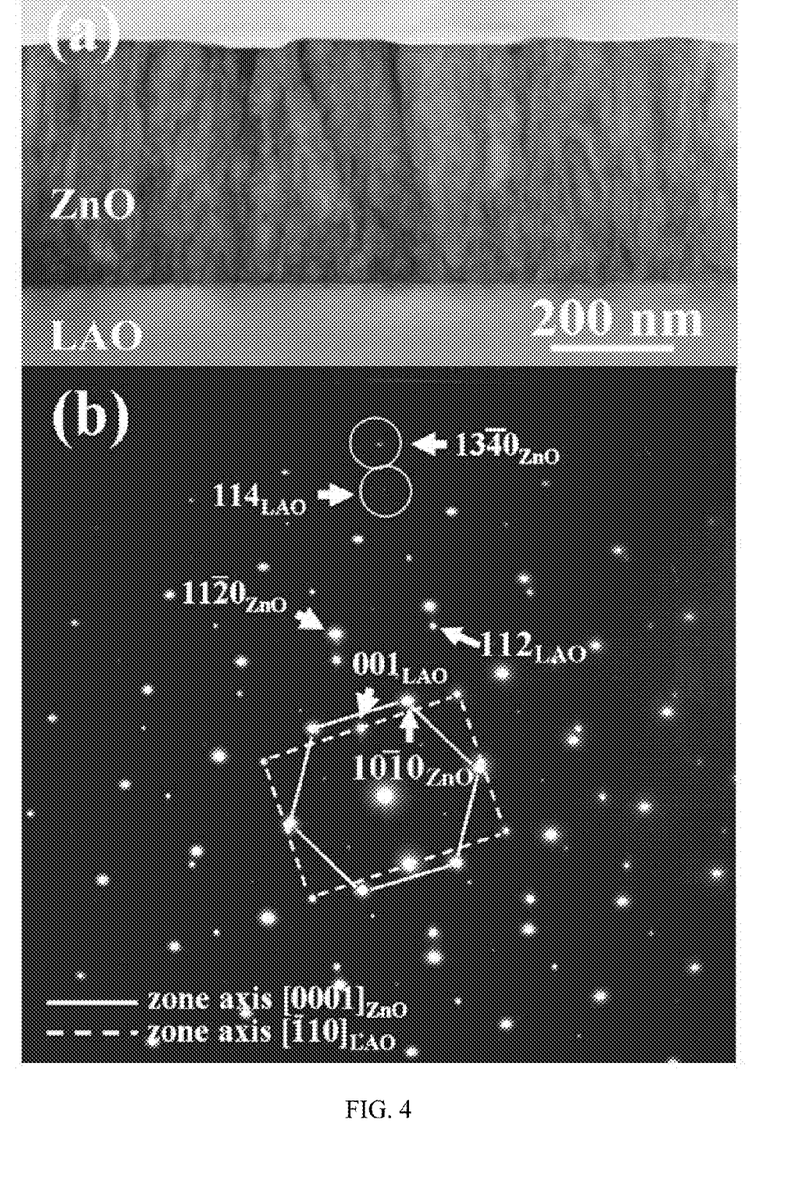
FIG. 4(a) is a TEM cross-section image of ZnO grown on the LaAlO$_3$ (114) plane.
FIG. 4(b) is a diffraction image of the selected portion in FIG. 4(a).

In a subsequent step, laser deposition process (DCA PLD-500 pulsed laser deposition system, KrF excimer laser with a wavelength of 248 nm and a frequency of 3-5 Hz) is employed with the background pressure maintained in an oxygen partial pressure of less than 20 ton at a temperature of 750° C. for 30 minutes to allow deposition to form the non-polar (13$\bar{4}$0) plane zinc oxide epitaxy layer. Specifically, FIG. 3 shows a schematic view of the zinc oxide non-polar (13$\bar{4}$0) plane, wherein the [13$\bar{4}$0] axis is perpendicular to the LaAlO$_3$ (114) plane, and the angle between the [13$\bar{4}$0] axis and the a-axis is 16°. In this Example, the (13$\bar{4}$0) plane zinc oxide epitaxy which only has the single domain grown on the LaAlO$_3$ (114) plane of the substrate. Finally, cross-section electron microscopy diffraction confirmed that the crystal plane grown according to the above-mentioned method is the unique (13$\bar{4}$0) plane. In addition, referring to FIGS. 4(a) and 4(b), FIG. 4(a) is a TEM cross-section image of ZnO grown on the LaAlO$_3$ (114) plane; and FIG. 4(b) is a diffraction image of the selected portion from FIG. 4(a). The result confirmed that the non-polar crystal plane is the (13$\bar{4}$0) plane, and the direction of c axis of the zinc oxide is perpendicular to the LaAlO$_3$ (114) crystal plane, namely [0001] ZnO/[$\bar{1}$ 10] LAO.

Figure 5A:
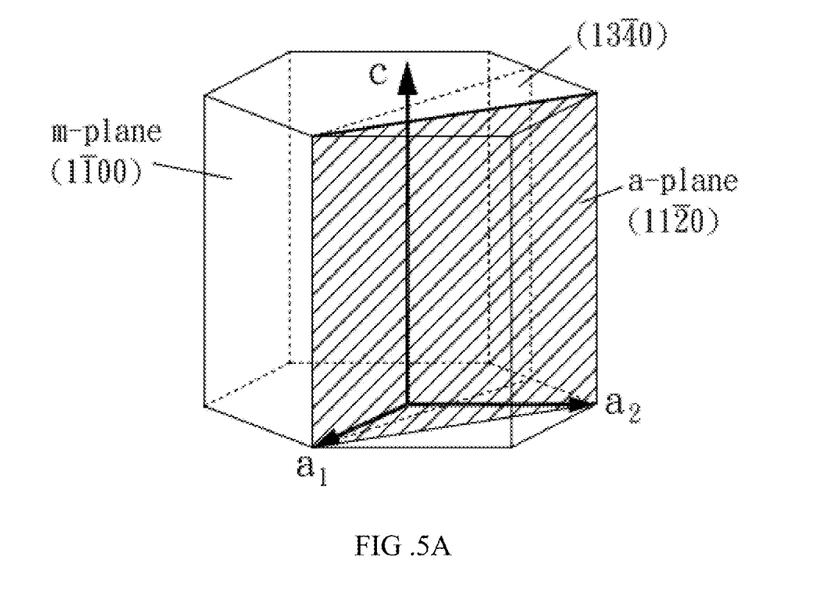
FIG. 5(a) is the schematic view of each plane of wurtzite structure.
Figure 5B:
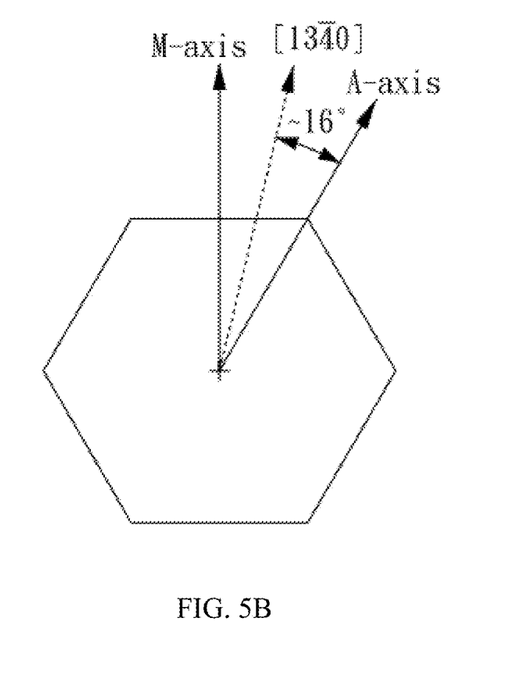
FIG. 5(b) is the wurtzite structure with the directions of m axis, [13$\bar{4}$0] axis, and a axis presented by the projection of c axis.

Therefore, the direction of the LaAlO$_3$ (114) crystal plane can be illustrated by FIGS. 5(a) and 5(b), wherein FIG. 5(a) is the schematic view of each plane of wurtzite structure; and FIG. 5(b) is the wurtzite structure with the directions of m axis, [13$\bar{4}$0] axis, and a-axis presented by the projection of c axis. It will be understood herein to the people of ordinary skill in the relevant art that an embodiment of the present invention includes that the (13$\bar{4}$0) plane and a plane (12$\bar{0}$0) intersect at a contained angle of approximately 16°.

EXAMPLE 2

Growth of the Non-Polar (13$\bar{4}$0) Crystal Plane of Nitride (III)

In this Example, the same procedure as disclosed in Example 1 is repeated except that the target material is replaced with Group III nitride, such as GaN. In Example 2, the Group III nitride epitaxy layer, such as GaN epitaxy layer, is deposited. The non-polar m plane of Group III nitride epitaxy layer, such as GaN epitaxy layer, grown by this Example may also achieve the same object and effect as that of Example 1.

In addition, although only GaN is given as an example, other target materials of Group III nitride, such as indium nitride, aluminum nitride, indium gallium nitride, aluminum gallium nitride, aluminum indium nitride, or aluminum indium gallium nitride etc., may also be used following the same procedure as in Example 1, to achieve the same object and effect.

TEST EXAMPLE 1

Figure 6:
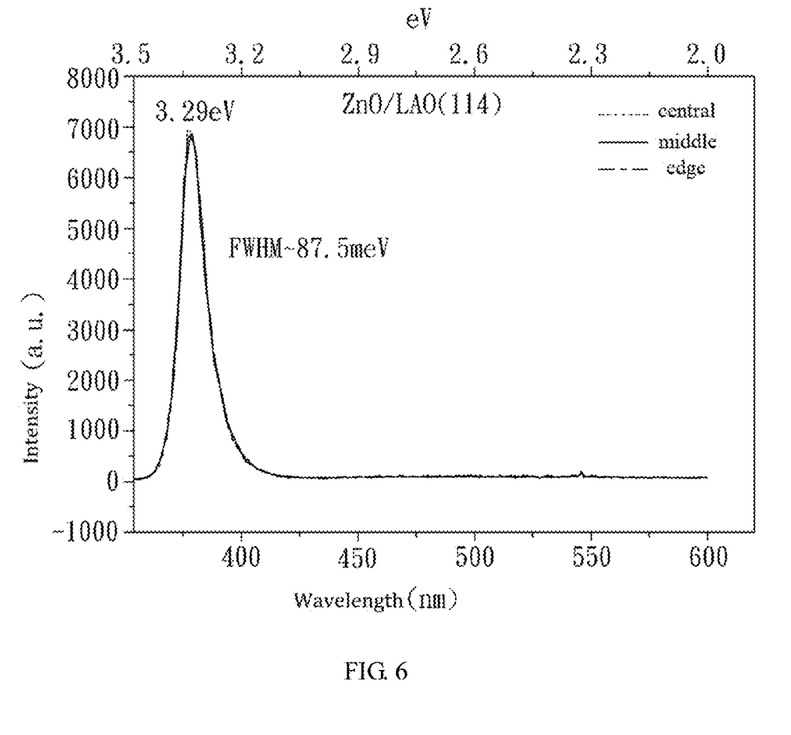
FIG. 6 shows the photoluminescence analysis diagram of the non-polar (13$\bar{4}$0) crystal plane of zinc oxide at room temperature.

Optical Property of the Non-Polar (13$\bar{4}$0) Crystal Plane of Zinc Oxide Referring to FIG. 6, it shows the photoluminescence analysis diagram of the non-polar ((13$\bar{4}$0) crystal plane of zinc oxide at room temperature. The optical property of the zinc oxide non-polar (13$\bar{4}$0) crystal plane can be known from the diagram, wherein the near band edge emission of the non-polar (13$\bar{4}$0) crystal plane measured by the photoluminescence analysis at room temperature is 3.29 eV, and the full width at half maximum (FWHM) reaches 87.5 meV under a non-optimized growing condition. This result showed an improved optical property over the common non-polar a-plane or m-plane of zinc oxide.

In this test example, to assure the uniformity of the epitaxy layers, the tests are performed simultaneously at the central, middle, and edge points of a 2-inch sample, and the photoluminescence diagrams at the three points of the sample are similar, indicating a good uniformity. Thus, the present invention has a high potential in the industrial application.

As illustrated in the above-mentioned Examples and Test Examples, the present invention provides a method for growing a novel non-polar (13$\bar{4}$0) plane epitaxy layer of wurtzite structure with a single crystal oxide as a substrate, and the non-polar (13$\bar{4}$0) crystal plane is obtained by growth of a specific cross section on a substrate, wherein the non-polar crystal plane has a better optical property than the existing a-plane and m-plane. In addition, the present invention also aims to provide a non-polar (13$\bar{4}$0) plane epitaxy layer to prevent the offsets of valence band and conduction band caused by the polarization effect generated by atom arrangement in the epitaxy layer that reduces the light-emitting quantum efficiency. In other words, the non-polar (13$\bar{4}$0) plane epitaxy layer of the present invention promotes the quantum efficiency as well as improves the light emitting efficiency through eliminating polarization effect, and has a better optical property that is beneficial to the application of a light emitting device.

While the disclosure has described by way of example and in terms of the preferred embodiments, it is to be understood that the disclosure is not limited to the disclosed embodiments. The scope of the appended claims should be accorded the broadest interpretation so as to encompass all such modifications and similar arrangements.

What is claimed is:

1. A method for growing a non-polar (13$\bar{4}$0) plane epitaxy layer of wurtzite structure, which comprises the following steps:
   providing a single crystal oxide with perovskite structure;
   selecting a plane of the single crystal oxide as a substrate; and
   forming a non-polar (13$\bar{4}$0) plane epitaxy layer of wurtzite semiconductors on the plane of the substrate by a vapor deposition process;
   wherein the single crystal oxide is an oxide with perovskite structure of $LaAlO_3$, $LaNiO_3$, $LaGaO_3$, $SrTiO_3$, $(LaSr)(AlTa)O_3$, $PrAlO_3$, or $NdAlO_3$;
   wherein the non-polar (13$\bar{4}$0) plane epitaxy layer is a zinc oxide, or a Group III nitride:
   wherein the zinc oxide is further doped with magnesium, calcium, strontium, barium, cadmium, aluminum, gallium, indium, or combinations thereof.

2. The method of claim 1, wherein the Group III nitride is gallium nitride, indium nitride, aluminum nitride, indium gallium nitride, aluminum gallium nitride, aluminum indium nitride, or aluminum indium gallium nitride.

3. The method of claim 1, wherein the plane is a crystal plane or a cross section of the single crystal oxide.

4. The method of claim 1, wherein the plane is a plane having a Miller index of {114} or other cross sections capable of growing the non-polar (13$\bar{4}$0) plane epitaxy layer of wurtzite semiconductors.

5. The method of claim 1, wherein the vapor deposition process is physical vapor deposition process or chemical vapor deposition process, which comprises pulsed laser coating process, sputtering process, electron beam (thermal) evaporation method, molecular beam epitaxy, or organic metal chemical vapor deposition.

6. The method of claim 1, further comprising cleaning the substrate with hot acetone and isopropanol before forming the non-polar (13$\bar{4}$0) plane epitaxy layer of wurtzite semiconductors on the plane of the substrate by a vapor deposition process.

7. An epitaxy layer having non-polar (13$\bar{4}$0) plane obtained by a method, which comprises the following steps:
   providing a single crystal oxide with perovskite structure;
   selecting a plane of the single crystal oxide as a substrate; and
   forming a non-polar (13$\bar{4}$0) plane epitaxy layer of wurtzite semiconductors on the plane of the substrate by a vapor deposition processi
   wherein the single crystal oxide as the substrate is an oxide with perovskite structure of $LaAlO_3$, $LaNiO_3$, $LaGaO_3$, $SrTiO_3$, $(LaSr)(AlTa)O_3$, $PrAlO_3$, or $NdAlO_3$;
   wherein the non-polar (13$\bar{4}$0) plane epitaxy layer is zinc oxide, or Group III nitride:
   wherein the zinc oxide is further doped with magnesium, calcium, strontium, barium, cadmium, aluminum, gallium, indium, or an alloy combined thereof.

8. The epitaxy layer having non-polar (13$\bar{4}$0) plane of claim 7, wherein the nitride (III) is gallium nitride, indium nitride, aluminum nitride, indium gallium nitride, aluminum gallium nitride, aluminum indium nitride, or aluminum indium gallium nitride complex.

9. The epitaxy layer having non-polar (13$\bar{4}$0) plane of claim 7, wherein the plane is a crystal plane or a cross section of the single crystal oxide.

10. The epitaxy layer having non-polar (13$\bar{4}$0) plane of claim 7, wherein the plane is a plane having a Miller index of {114} or other cross section capable of growing the non-polar (13$\bar{4}$0) plane epitaxy layer of wurtzite semiconductors.

11. The epitaxy layer having non-polar (13$\bar{4}$0) plane of claim 7, wherein the vapor deposition process is physical vapor deposition process or chemical vapor deposition process, which comprises pulsed laser deposition process, sputtering process, electron beam (thermal) evaporation method, molecular beam epitaxy, or organic metal chemical vapor deposition.

12. The epitaxy layer having non-polar (13$\bar{4}$0) plane of claim 7, wherein the method further comprises cleaning the substrate with hot acetone and isopropanol before growing the non-polar (13$\bar{4}$0) plane epitaxy layer of wurtzite semiconductors on the plane of the substrate by a vapor deposition process.

13. A photoelectric device, characterized in that using the non-polar (13$\bar{4}$0) plane epitaxy layer of wurtzite semiconductors of claims 7 as a semiconductor material.

14. The photoelectric device of claim 13, wherein the photoelectric device is a light emitting device, a detecting device, or a photovoltaic device.

\* \* \* \* \*